US011852681B2

(12) United States Patent
Kim

(10) Patent No.: US 11,852,681 B2
(45) Date of Patent: Dec. 26, 2023

(54) SPECTRAL LEAKAGE-BASED LOOPBACK METHOD FOR PREDICTING PERFORMANCE OF MIXED-SIGNAL CIRCUIT, AND SYSTEM THEREFOR

(71) Applicant: Industry-University Cooperation Foundation Hanyang University ERICA Campus, Ansan-si (KR)

(72) Inventor: Byoungho Kim, Ansan-si (KR)

(73) Assignee: INDUSTRY-UNIVERSITY COOPERATION FOUNDATION HANYANG UNIVERSITY ERICA CAMPUS, Gyeonggi-Do (KR)

( * ) Notice: Subject to any disclaimer, the term of this patent is extended or adjusted under 35 U.S.C. 154(b) by 0 days.

(21) Appl. No.: 17/788,511

(22) PCT Filed: Nov. 20, 2020

(86) PCT No.: PCT/KR2020/016511
§ 371 (c)(1),
(2) Date: Jun. 23, 2022

(87) PCT Pub. No.: WO2021/132894
PCT Pub. Date: Jul. 1, 2021

(65) Prior Publication Data
US 2023/0052971 A1    Feb. 16, 2023

(30) Foreign Application Priority Data
Dec. 24, 2019 (KR) .......................... 10-2019-0173630

(51) Int. Cl.
*G01R 31/317* (2006.01)
(52) U.S. Cl.
CPC . *G01R 31/31716* (2013.01); *G01R 31/31724* (2013.01)

(58) Field of Classification Search
None
See application file for complete search history.

(56) References Cited

U.S. PATENT DOCUMENTS

| 2014/0266824 A1* | 9/2014 | Lowney | H03M 1/1009 |
| | | | 341/120 |
| 2015/0030103 A1* | 1/2015 | Hormis | H04L 1/243 |
| | | | 375/296 |

(Continued)

FOREIGN PATENT DOCUMENTS

| JP | 10-096751 A | 4/1998 |
| JP | 2002-236151 A | 8/2002 |

(Continued)

OTHER PUBLICATIONS

Hongjoong Shin, Byoungho Kim and J. A. Abraham, "Spectral prediction for specification-based loopback test of embedded mixed-signal circuits," 24th IEEE VLSI Test Symposium, Berkeley, CA, USA, 2006, pp. 6-pp. 419, doi: 10.1109/VTS.2006.83. (Year: 2006).*

(Continued)

*Primary Examiner* — Daniel F. McMahon
(74) *Attorney, Agent, or Firm* — Burns & Levinson, LLP; Joseph M. Maraia

(57) ABSTRACT

A spectral leakage-driven loopback method for predicting performance of a mixed-signal circuit. The method includes generating, by an on-chip Digital Signal Processor (DSP) core, a digitally-synthesized single-tone sinusoidal stimulus. A nonlinear digital-to-analog-converter (DAC) channel is sampled. A DAC output signal is supplied to a nonlinear analog-to-digital converter (ADC) channel through an analog loopback path. Each of the DAC channel and the ADC channel are measured for a production testing. The on-chip DSP core performs postprocessing and predicting harmonics of the two individual DAC and ADC channels.

17 Claims, 8 Drawing Sheets

(56) References Cited

U.S. PATENT DOCUMENTS

2015/0120219 A1* 4/2015 Merlin ................ H04B 1/0458
   702/58
2015/0323640 A1* 11/2015 Lu ........................ G01R 35/005
   702/191
2019/0190530 A1* 6/2019 Rakuljic ............. H03M 1/1033

FOREIGN PATENT DOCUMENTS

| JP | 2011-013122 A | 1/2011 |
| JP | 2012-120229 A | 6/2012 |

OTHER PUBLICATIONS

H. Shin, J. Park and J. A. Abraham, "A Statistical Digital Equalizer for Loopback-based Linearity Test of Data Converters," 2006 15th Asian Test Symposium, Fukuoka, Japan, 2006, pp. 245-250, doi: 10.1109/ATS.2006.261027. (Year: 2006).*

"Spectral Leakage-Driven Loopback Scheme for Prediction of Mixed-Signal Circuit Specifications," Kim et al., IEEE Transactions on Industrial Electronics, vol. 66, No. 1, Jan. 2019.

* cited by examiner

FIG. 3B
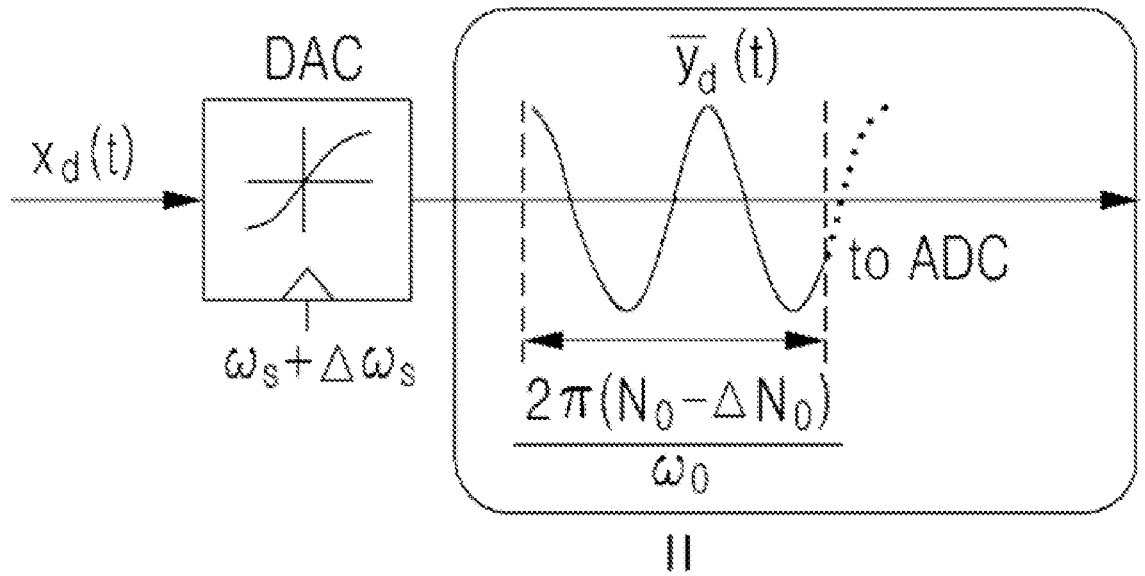
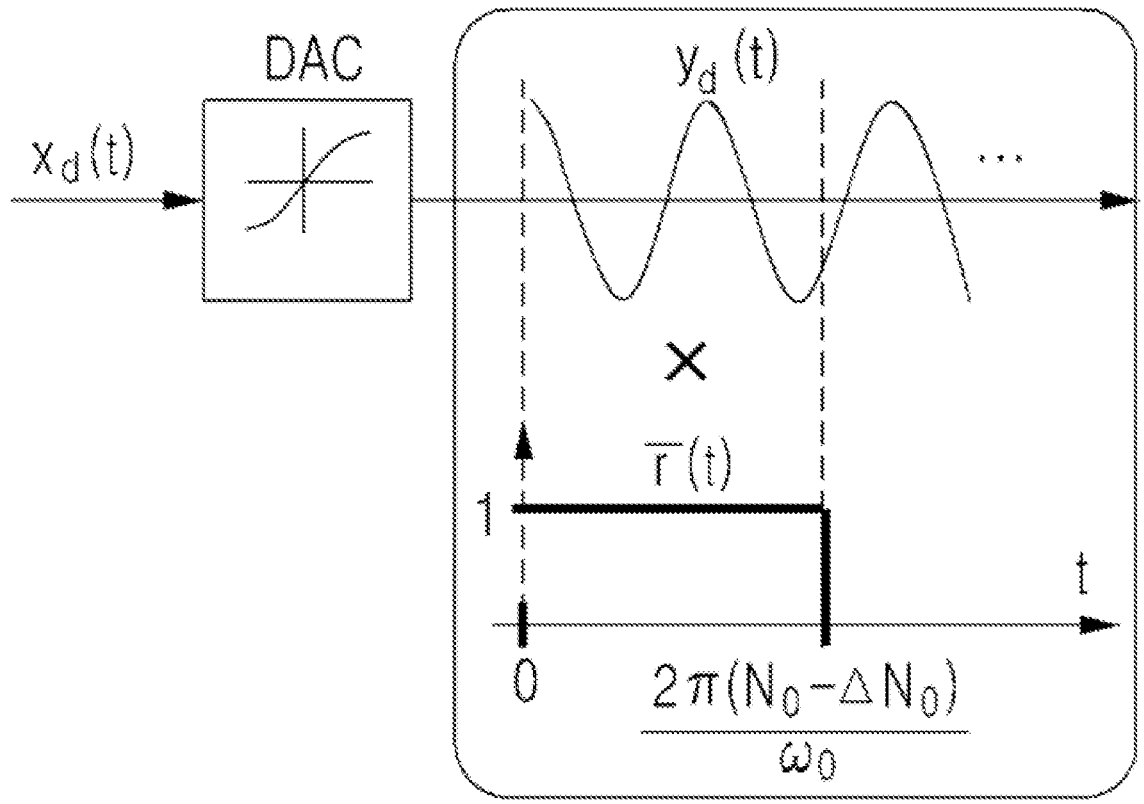

SPECTRAL LEAKAGE-BASED LOOPBACK METHOD FOR PREDICTING PERFORMANCE OF MIXED-SIGNAL CIRCUIT, AND SYSTEM THEREFOR

CROSS-REFERENCE TO RELATED APPLICATIONS

This is a national stage application filed under 37 U.S.C. 371 based on International Patent Application No. PCT/KR2020/016511, filed Nov. 20, 2020, which claims priority to Korean Patent Application No. 10-2019-0173630, filed Dec. 24, 2019, the disclosures of which are incorporated herein by reference in their entireties.

TECHNICAL FIELD

The present invention relates to a spectral leakage-driven loopback method and system for predicting performance of a mixed-signal circuit and, more particularly to a loopback method and system for a spectral leakage-driven built-in self-test (BIST) that may achieve a cost efficiency by precisely predicting nonlinearity of a mixed-signal circuit in a loopback mode.

BACKGROUND OF THE DISCLOSURE

An application specific integrated circuit (ASIC) technology has evolved from a chip-set system in which a plurality of functional blocks is configured as a plurality of chips to a system on chip (SoC) that is a system in which a plurality of functional blocks is embedded. An integrated circuit of the SoC includes various functional blocks, such as a microprocessor, an interface, a memory array, and a digital signal processor (DSP).

Since a typical circuit test uses automated-test-equipment and also a new algorithm needs to be developed, intensive manpower and resources are used, testing cost is expensive, and a test time is long. To resolve this, a method (e.g., a bult-in self-test (BIST)) for performing a circuit test on a circuit chip using a simple algorithm and a simple circuit is required. As an example of related art thereto, a circuit test is performed by embedding a high-resolution analog-to-digital converter (ADC) and an existing algorithm in a circuit chip.

However, since the aforementioned method uses the high-resolution ADC, an area overhead increases and a power assumption also increases. Also, the rising cost of production testing for a SoC performed in the process of producing SoCs has emerged as one of the crucial issues for chip makers due to a long test time and costly automated test equipment (ATE).

DETAILED DESCRIPTION

Technical Object

An object of the present invention is to provide a loopback method and system for a spectral leakage-driven built-in self-test (BIST) that may achieve cost efficiency by precisely predicting nonlinearity of a mixed-signal circuit in a loopback mode.

Technical Solution

A spectral leakage-driven loopback method for predicting performance of a mixed-signal circuit according to an example embodiment includes generating, by an on-chip DSP (Digital Signal Processor) core, a digitally-synthesized single-tone sinusoidal stimulus, sampling in a nonlinear digital-to-analog converter (DAC) channel, supplying a DAC output signal to a nonlinear analog-to-digital converter (ADC) channel through an analog loopback path, and measuring each of the DAC channel and the ADC channel for a production testing; and performing, by the on-chip DSP core, postprocessing and predicting harmonics of the two individual DAC channel and ADC channel.

Here, the loopback method for predicting the performance of the mixed-signal circuit may further include modeling a correlation by deriving a transfer function of a loopback path prior to measuring each of the DAC channel and the ADC channel.

Effect of Invention

According to some example embodiments, it is possible to perform a spectral leakage-driven built-in self-test (BIST) that may achieve cost efficiency by precisely predicting nonlinearity of a mixed-signal circuit in a loopback mode and to minimize a hardware measurement result prediction error and to use the same actually for a production testing.

DESCRIPTION OF THE DRAWINGS

FIGS. 3A and 3B illustrate sampled signals according to an example embodiment.

DETAILED DESCRIPTION

Figure 1:
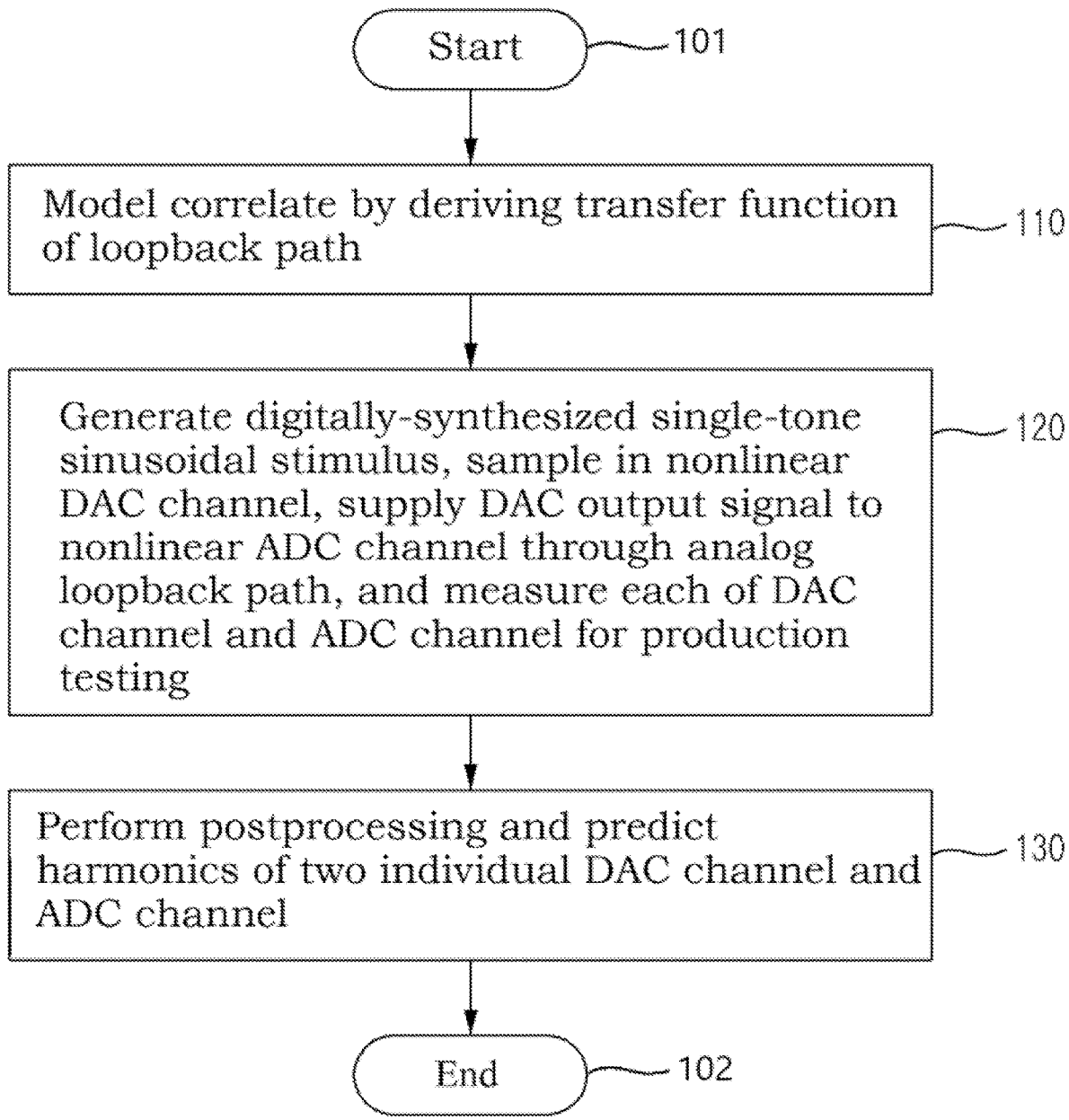
FIG. 1 is a flowchart illustrating a loopback method for predicting performance of a mixed-signal circuit according to an example embodiment.

Hereinafter, example embodiments disclosed herein will be described with reference to the accompanying drawings. However, the present invention is not limited thereto or restricted thereby. Also, reference numerals used in the respective drawings refer to like elements throughout.

FIG. 1 is a flowchart illustrating a loopback method for predicting performance of a mixed-signal circuit according to an example embodiment.

Referring to FIG. 1, in operation 120, an on-chip DSP core generates a digitally-synthesized single-tone sinusoidal stimulus, samples in a nonlinear digital-to-analog converter (DAC) channel, supplies a DAC output signal to a nonlinear analog-to-digital converter (ADC) channel through an analog loopback path, and measures each of the DAC channel and the ADC channel for a production testing.

In operation 130, the on-chip DSP core performs postprocessing and predicts harmonics of two individual DAC channel and ADC channel. Next, end operation 102 is performed.

The spectral leakage-driven loopback method for predicting the performance of the mixed-signal circuit according to an example embodiment performs operation 110 prior to performing operation 120.

Hereinafter, operations 110 to 130 of the loopback method for predicting the performance of the mixed-signal circuit of FIG. 1 are described with reference to FIGS. 2 to 4B.

Figure 2:
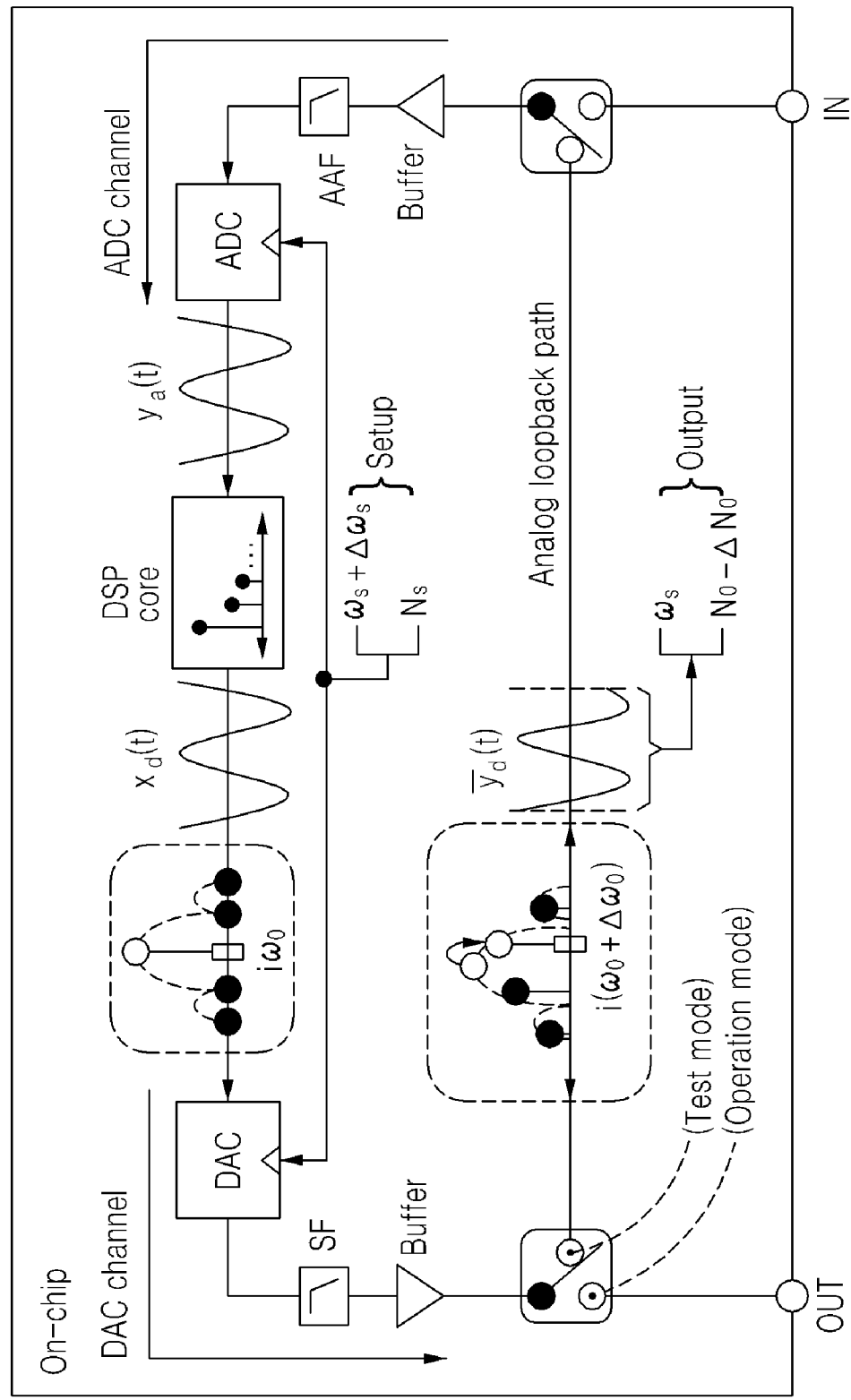
FIG. 2 illustrates a loopback configuration proposed for a system on chip (SoC) according to an example embodiment.
Figure 3A:
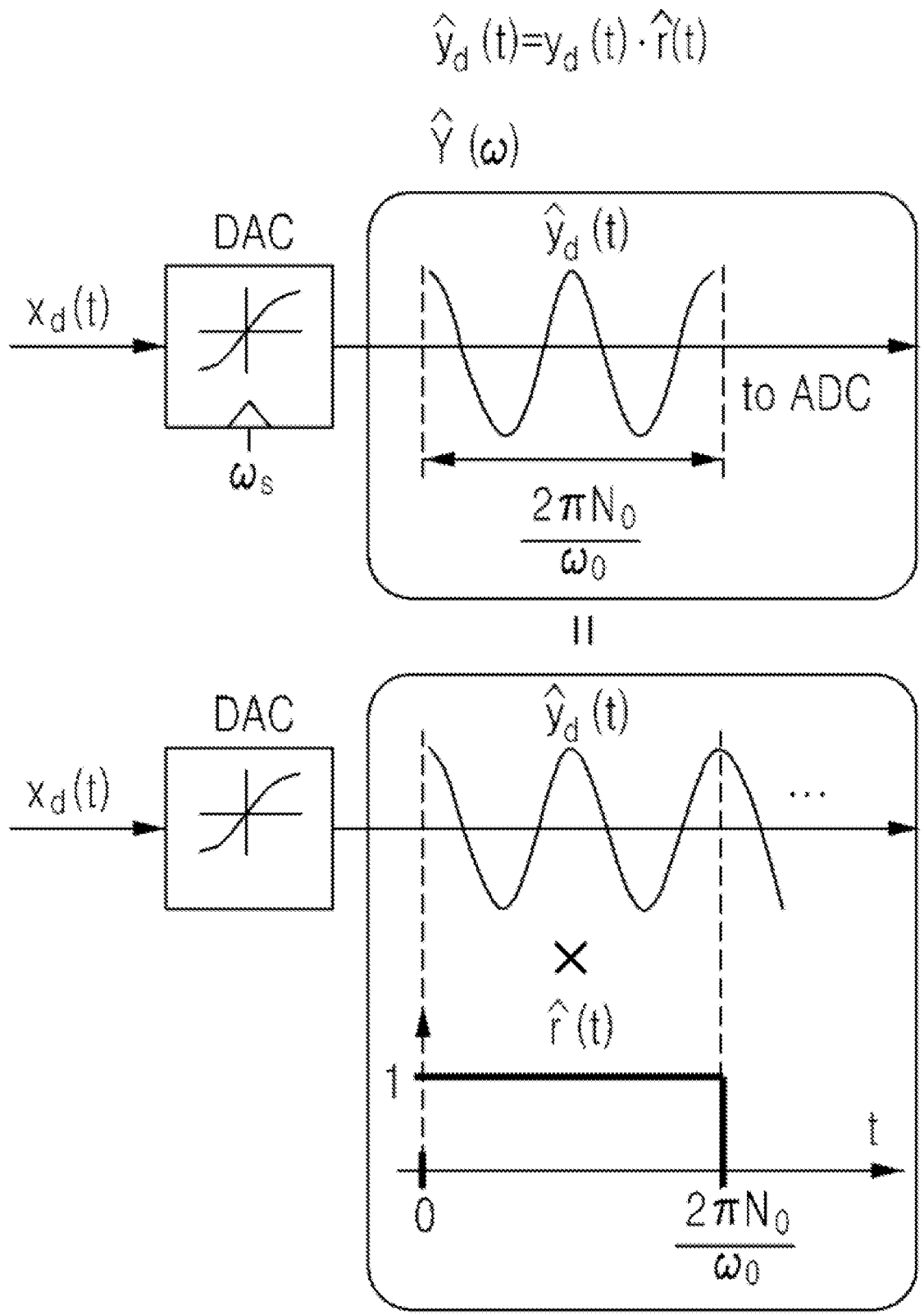
Figure 4A:
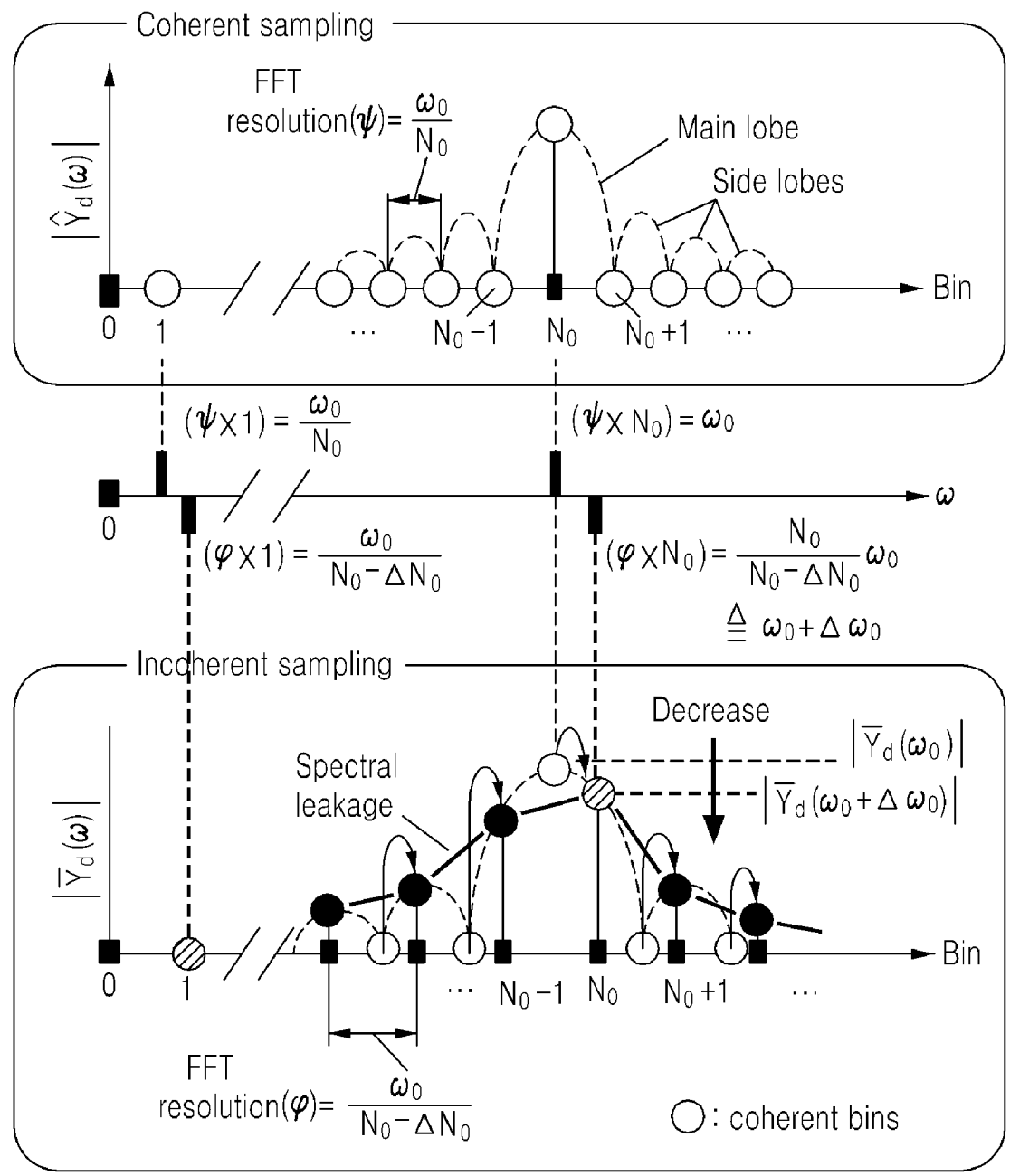
FIGS. 4A and 4B illustrate a spectrum of sampled signals according to an example embodiment.
Figure 4B:
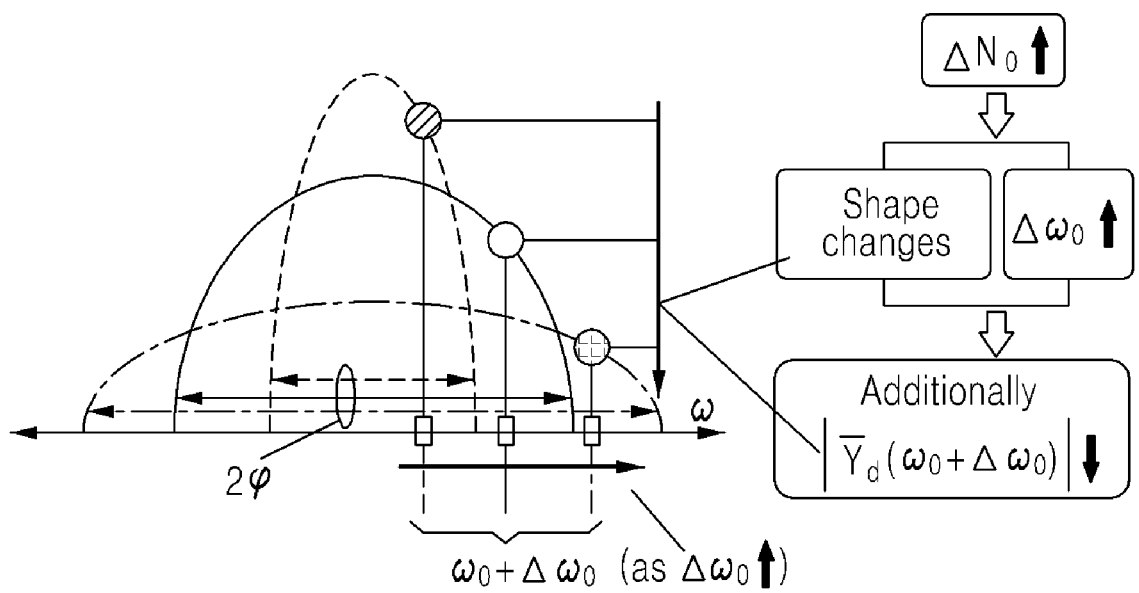

FIG. 2 illustrates a loopback configuration proposed for a system on chip (SoC) according to an example embodiment, FIGS. 3A and 3B illustrate sampled signals according to an example embodiment, and FIGS. 4A and 4B illustrate a spectrum of sampled signals according to an example embodiment.

Referring to FIG. 2, the SoC includes an antialiasing filter (AAF) to prevent aliasing and a smoothing filter (SF) to alleviate imaging. Here, an ADC channel and a DAC channel configured as a buffer are connected to an input terminal and an output terminal, respectively, in an operation mode. An analog loopback path is formed between the DAC channel and the ADC channel in a test mode, which is the same as in the existing loopback est.

Referring to FIG. 1, in operation 110 after start operation 101, a correlation may be modeled by deriving a transfer function of the loopback path.

In operation 110, a specific model may be acquired by deriving the transfer function of the loopback path that is a path from the DAC channel to the ADC channel through the analog loopback path and thereby modeling the correlation. Here, the specific model may represent the following Equation 13, and may describe loopback responses that are determined by individual DAC and ADC harmonic coefficients ($\Delta w_s$) and harmonics of the DAC channel and the ADC channel.

For example, to mathematically identify the individual ADC channels and harmonic coefficients of the ADC channels, the specific model uses two sets of spectral loopback responses. Each model is derived in a form of a simultaneous equation model using an incoherent sampling factor ($\Delta w_s$). Therefore, solutions for DAC and ADC harmonic coefficients may be formulated by solving two sets of models and the solutions are identified only once through operation 110 prior to production testing or operation 120.

Referring to FIG. 2, in operation 120, the on-chip DSP core may generate the digitally-synthesized single-tone sinusoidal stimulus $x_d(t)=\cos(w_0 t)$. Here, the digitally-synthesized single-tone sinusoidal stimulus may be sampled for test purpose by a nonlinear DAC channel (a device under Test (DUT)) that is clocked at $w_s+\Delta w_s$.

An incoherently sampled DAC output signal $\bar{y}_d(t)$ may represent a correlation between DAC harmonics and the spectral leakage introduced by an incoherent sampling factor $\Delta w_s$. Here, an increase of the incoherent sampling factor $\Delta w_s$ introduces an increase of spectral leakage power that surrounds DUT harmonics present in the DAC output signal $\bar{y}_d(t)$. Therefore, the harmonics needs to be decreased by the increased power of the spectral leakage.

In operation 120, the spectrally weighted DAC output signal $\bar{y}_d(t)$ may be delivered to the nonlinear ADC channel (another DUT) through the analog loopback path. Here, the analog loopback path delivers the spectrally weighted DAC output signal $\bar{y}_d(t)$ to another DUT (e.g., the nonlinear ADC channel) without any modification of the sampled DAC output signal $\bar{y}_d(t)$.

Also, to synchronize the DAC output signal $\bar{y}_d(t)$ sampled in the DAC channel, the ADC channel is also clocked at $w_s+\Delta w_s$. The loopback response through the analog loopback path may represent a correlation between the ADC harmonics and the DAC output signal $\bar{y}_d(t)$ according to the spectral leakage through the DAC harmonics and the incoherent sampling factor $\Delta w_s$.

Here, the loopback response $\bar{y}_a(t)$ is experimentally measured a second time using a value of the incoherent sampling factor $\Delta w_s$ is one at a time for postprocessing in operation 130. Synchronization between DAC sampling and ADC sampling is performed based on an edge of a reference sampling clock signal as in conventional testing. Subsequently, the decreased harmonics and the increased spectral leakage needs to be observed from spectral expression of the measured loopback response $\bar{y}_a(t)$ as in the DAC output signal $\bar{y}_d(t)$.

In operation 130, postprocessing may be performed by the on-chip DSP core to calculate the DUT harmonics and harmonics of the two individual DAC channel and ADC channel may be predicted.

In operation 130, the harmonic coefficients of the individual DAC and ADC channels may be calculated from the loopback response and the incoherent sampling factor $\Delta w_s$ through the analog loopback path.

Hereinafter, describing the spectral leakage according to an example embodiment, a spectral leakage theory that is processed from the digitally-synthesized single-tone sinusoidal stimulus $x_d(t)$ of FIG. 2 to the DAC output signal $\bar{y}_d(t)$ is described through comparison of sampling output results of FIGS. 3A and 3B.

The DAC output signal $\bar{y}_d(t)$ refers to a signal shown in an upper DAC of FIG. 3A and a signal that is dynamically sampled by the DAC for $$0 < t < N_0 T_0 = \frac{2\pi N_0}{\omega_0}.$$

Here, $T_0$ denotes a single period time of a sinusoid.

Also, with the assumption that, in a lower DAC of FIG. 3A, $\hat{y}_d(t)$ is another DAC output sampled for an infinite time, acquiring the DAC output signal ($\bar{y}_d(t)$) is equivalent to multiplexing $\hat{y}_d(t)$ by a rectangular function $\hat{r}(t)$. That is, $$\hat{y}_d(t) = y_d(t) \cdot \hat{r}(t) \text{ or } \hat{Y}_d(\omega) = \frac{1}{2\pi} Y_d(\omega) \circledast \hat{R}(\omega).$$

Here, $\hat{Y}_d(w)$, $Y_d(w)$, $\hat{R}(w)$ refer to spectral expressions of $\hat{y}_d(t)$, $y_d(t)$, and $\hat{r}(t)$ of FIG. 3A, respectively. ⊛ denotes a spectral convolution operator. Therefore, $\hat{y}_d(t)$ is also represented using the rectangular function $\hat{r}(t)$ with a time duration of $N_0 T_0$.

Referring to FIG. 3B, the DAC output signal $\bar{y}_d(t)$ refers to a signal that is sampled contradictory to $$0 < t < (N_0 - \Delta N_0) T_0 = \frac{2\pi(N_0 - \Delta N_0)}{\omega_0}.$$

Also, $$\bar{y}_d(t) = y_d(t) \cdot \bar{r}(t) \text{ or } \bar{Y}_d(\omega) = \frac{1}{2\pi} Y_d(\omega) \circledast \bar{R}(\omega).$$

Here, the DAC output signal ($\bar{y}_d(t)$) refers to spectral expressions of $\bar{y}_d(t)$ and a rectangular function $\bar{r}(t)$. Basically, the DAC output signal $\overline{y}$ may be expressed with a period change $\Delta N_0$ that may replace variation of sampling frequency DAC and ADC harmonic coefficient $\Delta w_s$. Here, $\hat{r}(t)$ and $\bar{r}(t)$ are irrelevant to a window function used to alleviate the spectral leakage of a sampled signal.

The spectral leakage theory processed from the DAC output signal $\overline{y}_d(t)$ to the loopback response $\hat{y}_d(t)$ in FIG. 2 is discussed as follows.

The ADC of FIG. 2 is assumed to be an ideal digitizer clocked at $w_s+\Delta w_s$ for better understanding and may sample $\hat{y}_d(t)$ $\overline{y}$ or $|\hat{Y}_d(w)|$ and $|\overline{Y}_d(w)|$, respectively. $\hat{Y}_d(w)|$ and $|\overline{Y}_d(w)|$ are compared in two boxes of FIG. 4A, focusing on their fundamental tones. Horizontal Bin axes in the two boxes are aligned together with w-axis, which is shown between the two boxes. For an upper box of FIG. 4A, a fast Fourier transform (FFT) frequency resolution $$\psi = \frac{\omega_0}{N_0}$$

may be calculated for coherent sampling.

$$\hat{Y}_d(\omega) = \frac{1}{2\pi} Y_d(\omega) \circledast \hat{R}(\omega)$$

is represented as a sinc function that is shifted to $w_0$ in w-axis using an FFT multiplication property. Also, $w_0$ in w-axis corresponds to $N_0$. Similarly, for a lower box of FIG. 4A, $|\overline{Y}_d(w)|$ is represented as a sinc function that is shifted to $w_0$ in w-axis.

The FFT frequency resolution is expressed as $$\varphi = \frac{\omega_s + \Delta\omega_s}{N_s} = \frac{\omega_0}{N_0 - \Delta N_0}$$

for incoherent sampling. This results in $\varphi > \psi$. Therefore, a frequency corresponding to an $N_0$-th bin is $$\frac{N_0}{N_0 - \Delta N_0} \omega_0,$$

which is higher than $w_0$ for the $N_0$-th bin for $|\hat{Y}_d(w)|$ shown in the W-axis and also which is greater than a center frequency of a main lobe of $|\overline{Y}_d(w)|$. If $0<\varepsilon<1$ and $\Delta w_0$ is a positive value, the frequency may be further simplified as follows:

$$\varphi N_0 = \frac{\omega_0}{N_0 - \Delta N_0} \omega_0 = (1+\varepsilon)\omega_0 \triangleq \omega_0 + \Delta\omega_0.$$

If $w_s-\Delta w_s$ is set instead of $w_s+\Delta w_s$, $\Delta w_0$ may also be a negative value.

In addition, since harmonics may be buried in the spectral leakage power increased with $\Delta w_0$ in loopback responses, $\Delta w_0$ needs to be small enough to avoid the above situation. As a result, since the bin $w_0$ is invisible on the spectrum of $|\overline{Y}_d(w)|$, it can be seen that the fundamental tone is shifted from $w_0$ to $w_0+\Delta w_0$ due to $\Delta N_0$ as a weighting factor.

Referring to FIG. 4B, it can be seen that, according to an increase in No, the main lobe of $|\overline{Y}_d(w)|$ becomes wider in width and shorter in height and $w_0+\Delta w_0$ also increases. Therefore, $|\overline{Y}_d(w_0+\Delta w_0)|$ additionally decreases and the same spectral process is performed for each harmonic.

Figure 5:
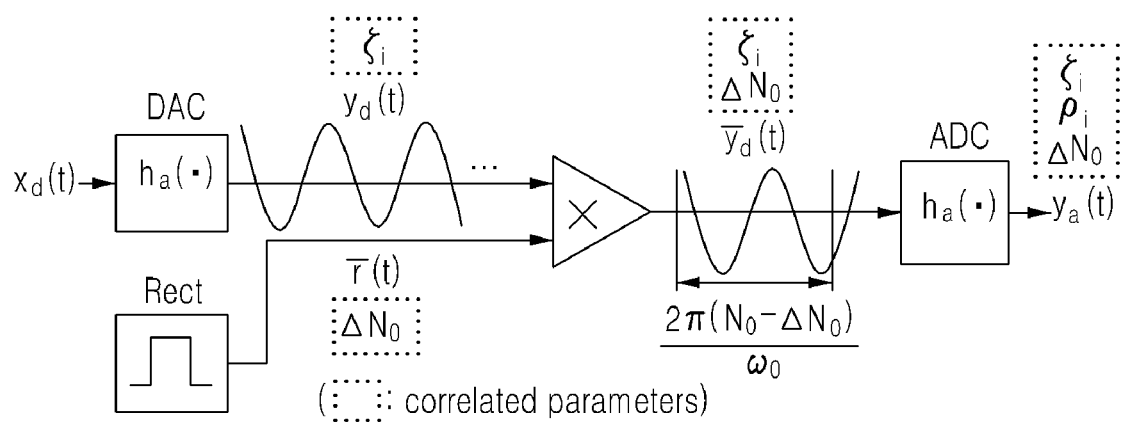
FIG. 5 illustrates an example of a loopback configuration according to an example embodiment.

FIG. 5 illustrates an example of a loopback configuration according to an example embodiment.

FIG. 5 shows a loopback configuration proposed herein for a quantitative model using a period variation, that is, $\Delta N_0$.

Harmonic distortion is considered up to third order for simplicity.

In a first stage, a digitally-synthesized single-tone sinusoidal stimulus $x_d(t)=\cos(w_0 t)$ is applied to a DAC channel, hd(•), which is modeled with a symmetrical Taylor expansion. Here, $\hat{y}_d(t)$ and $Y_d(w)$ may be represented as the following Equation 1.

$$y_d(t) = h_d(x_d(t)) = \sum_i \zeta_i \cos^i(\omega_0 t) \qquad \text{(Equation 1)}$$

$$= \overline{\zeta}_1 \cos(\omega_0 t) + \overline{\zeta}_2 \cos(2\omega_0 t) + \overline{\zeta}_3 \cos(3\omega_0 t)$$

$$Y_d(\omega) = \underbrace{\overline{\zeta}_1 \pi \delta(\omega - \omega_0)}_{Y_{d1}(\omega)} + \underbrace{\overline{\zeta}_2 \pi \delta(\omega - 2\omega_0)}_{Y_{d2}(\omega)} + \underbrace{\overline{\zeta}_3 \pi \delta(\omega - 3\omega_0)}_{Y_{d3}(\omega)}$$

In Equation 1, $\zeta_i$ denotes an $i^{th}$ harmonic coefficient of a DAC channel and $$\overline{\zeta}_1 = \zeta_1 + \frac{3\zeta_3}{4}, \overline{\zeta}_2 = \frac{\zeta_2}{2}, \text{ and } \overline{\zeta}_3 = \frac{\zeta_3}{4}.$$

Also, $Y_{d1}(w)$, $Y_{d2}(w)$, and $Y_{d3}(w)$ represent a fundamental signal, a second-order harmonic, and a third-order harmonic of the DAC output in a spectral domain, respectively.

As discussed in FIG. 3B, $\overline{y}_d(t)$ and $\overline{Y}_d(w)$ are modeled as the following Equation 2 and Equation 3.

$$\overline{y}_d(t) = y_d(t)\overline{r}(t) \qquad \text{(Equation 3)}$$

$$\overline{Y}_d(\omega) = \frac{1}{2\pi}\{Y_{d1}(\omega)\circledast\overline{R}(\omega) + Y_{d2}(\omega)\circledast\overline{R}(\omega) + Y_{d3}(\omega)\circledast\overline{R}(\omega)\}$$

$$r(t) = \begin{cases} 1 & \text{if } 0 < t < \frac{2\pi(N_0 - \Delta N_0)}{\omega_0} \\ 0 & \text{elsewhere} \end{cases}.$$

$$\overline{R}(\omega) = \frac{2\pi(N_0 - \Delta N_0)}{\omega_0}\text{sinc}\left(\frac{N_0 - \Delta N_0}{\omega_0}\omega\right) \qquad \text{(Equation 4)}$$

Here, the spectral expression of the rectangular function $\hat{r}(t)$ for $$0 < t < \frac{2\pi(N_0 - \Delta N_0)}{\omega_0}$$

may be given as the following Equation 4.

Here, $Y_{d1}(w) \circledast \overline{R}(w)$ of Equation 2 may be calculated using $Y_{d1}(w)$ in Equation 1 and $\overline{R}(w)$ of Equation 4 based on an FFT multiplication property, as in the following Equation 5.

$$Y_{d1}(\omega) \circledast \overline{R}(\omega) = \frac{2\pi^2}{\varphi}\left(\zeta_1 + \frac{3\zeta_3}{4}\right)\mathrm{sinc}\left(\frac{\omega-\omega_0}{\varphi}\right) \quad \langle\text{Equation 5}\rangle$$

In Equation 5, $$\varphi = \frac{\omega_0}{N_0 - \Delta N_0}.$$

Similarly, other two convolution terms of Equation 2 are calculated through the following Equation 6.

$$Y_{d2}(\omega)\circledast \overline{R}(\omega) = \frac{\pi^2\zeta_2}{\varphi}\mathrm{sinc}\left(\frac{\omega-2\omega_0}{\varphi}\right)$$

$$Y_{d3}(\omega)\circledast \overline{R}(\omega) = \frac{\pi^2\zeta_3}{2\varphi}\mathrm{sinc}\left(\frac{\omega-3\omega_0}{\varphi}\right)$$

The aforementioned Equation 2 may be re-formulated as in the following Equation 7.

$$\overline{Y}_d(\omega) = \frac{\pi}{2\varphi}\left\{\left(2\zeta_1 + \frac{3\zeta_3}{2}\right)\mathrm{sinc}\left(\frac{\omega-\omega_0}{\varphi}\right) + \right. \quad \langle\text{Equation 7}\rangle$$
$$\left. \zeta_2 \mathrm{sinc}\left(\frac{\omega-2\omega_0}{\varphi}\right) + \frac{\zeta_3}{2}\mathrm{sinc}\left(\frac{\omega-3\omega_0}{\varphi}\right)\right\}$$

Therefore, $\zeta_i$ and $\Delta N_0$ are correlated with $\overline{Y}_d(w)$ as shown in Equation 7. Then, using $\overline{Y}_d(w)$ discussed as follows in FIG. 4A, that is, Equation 5, the decreased fundamental tone of $|\overline{Y}_d(w_0+\Delta w_0)|$ may be identified as in the following Equation 8.

$$Y_{d1}(\omega)\circledast \overline{R}(\omega)\big|_{\omega=\varphi N_0} = \frac{2\pi^2}{\varphi}\left(\zeta_1 + \frac{3\zeta_3}{4}\right)\mathrm{sinc}(\Delta N_0) \quad \langle\text{Equation 8}\rangle$$

Similarly, the decreased magnitudes of harmonics may be identified from Equation 6 through the following Equation 9.

$$Y_{d2}(\omega)\circledast \overline{R}(\omega)\big|_{\omega=2N_0\varphi} = \frac{\pi^2\zeta_2}{\varphi}\mathrm{sinc}(2\Delta N_0) \quad \langle\text{Equation 9}\rangle$$

$$Y_{d3}(\omega)\circledast \overline{R}(\omega)\big|_{\omega=3N_0\varphi} = \frac{\pi^2\zeta_3}{2\varphi}\mathrm{sinc}(3\Delta N_0)$$

Next, $\overline{y}_d(t)$ (or $\overline{Y}_d(w)$ in Equation 7) is applied to the ADC channel and $h_a(\cdot)$ is represented as in the following Equation 10.

$$y_a(t) = h_a(\overline{y}_d(t)) = \sum_i \rho_i \overline{y}_d^i(t) \quad \langle\text{Equation 10}\rangle$$

$$Y_a(\omega) = \sum_i (2\pi)^{1-i}\rho_i \overline{Y}_d^{\circledast(i-1)}(\omega)$$

In Equation 10, $\rho_i$ denotes an i-th harmonic coefficient of the ADC channel and $Y_a(w)$ denotes a spectral representation of $y_a(t)$. As in Equation 10, $\zeta_i$, $\rho_i$, and $\Delta N_0$ are correlated with $Y_a(w)$.

Here, $\overline{Y}_d^{\circledast 1}(w)$ in Equation 10 may be identified as in the following Equation 11.

$$\overline{Y}_d^{\circledast 1}(\omega) = (\overline{Y}_{d_F}(\omega) + \overline{Y}_{d_H}(\omega))^{\circledast 1} \quad \langle\text{Equation 11}\rangle$$

$$= \overline{Y}_{d_F}^{\circledast 1}(\omega) + 2\overline{Y}_{d_F}(\omega)\circledast \overline{Y}_{d_H}(\omega) + \overline{Y}_{d_H}^{\circledast 1}(\omega)$$

In Equation 11, $Y_{d_f}(w)$ and $Y_{d_H}(w)$ represent and spectral responses of the fundamental term and a spectral sum of second and third harmonics, respectively. Frequency convolution power $\circledast$ i itself indicates an i-fold iteration of the convolution. Similarly, $\overline{Y}_d^{\circledast 2}(w)$ in Equation 10 may be identified as in the following Equation 12.

$$\overline{Y}_d^{\circledast 2}(w) = (\overline{Y}_{d_F}(w) + \overline{Y}_{d_H}(\omega))^{\circledast 2} \quad \langle\text{Equation 12}\rangle$$

Finally, using $i\overline{w}_0$ (i=1, 2, 3) and Equation 11, Equation 10 may be expressed as each harmonic magnitude as in the following Equation 13.

$$\begin{cases} |Y_a(\overline{\omega}_0)| = |\varrho_1 \overline{Y}_d(\overline{\omega}_0) + \varrho_2 \overline{Y}_d^{\circledast 1}(\overline{\omega}_0) + \varrho_3 \overline{Y}_d^{\circledast 2}(\overline{\omega}_0)| \\ |Y_a(2\overline{\omega}_0)| = |\varrho_1 \overline{Y}_d(2\overline{\omega}_0) + \varrho_2 \overline{Y}_d^{\circledast 1}(2\overline{\omega}_0) + \varrho_3 \overline{Y}_d^{\circledast 2}(2\overline{\omega}_0)| \\ |Y_a(3\overline{\omega}_0)| = |\varrho_1 \overline{Y}_d(3\overline{\omega}_0) + \varrho_2 \overline{Y}_d^{\circledast 1}(3\overline{\omega}_0) + \varrho_3 \overline{Y}_d^{\circledast 2}(3\overline{\omega}_0)| \end{cases} \quad \langle\text{Equation 13}\rangle$$

Here, $\varrho_1 = \rho_1$, $\varrho_2 = (2\pi)^{-1}\rho_2$, $\varrho_3 = (2\pi)^{-2}\rho_3$, and $\overline{w}_0 = \varphi N_0$.

Here, Equation 13 represents a subset of Equation 10 for overall spectral response and thus, represents a characteristic model according to an example embodiment to characterize harmonics of DUTs.

$Y_a(i\overline{w}_0)$ in the characteristic model, that is, Equation 13 inherently has the identical correlation with $\zeta_i$, $\rho_i$ and $\Delta N_0$ as in $Y_a(w)$ in Equation 10.

Here, if DAC and ADC harmonic coefficients $\Delta w_s$ is are set on a specific value $^I\Delta w_s$, all equations from Equation 1 to Equation 10 are derived using $^I\Delta w_s$ based on the correlation shown in FIG. 5 and $\overline{R}(w)$, $\overline{Y}_d(w)$, and $Y_a(w)$ are accordingly specified as $^I\overline{R}(w)$, $^I\overline{Y}_d(w)$, and $^IY_a(w)$, respectively.

Then, a first set of Equation 13 may be generated by replacing corresponding variables in three equations of Equation 13 with $^I\overline{Y}_d(i\overline{w}_0)$ and $^IY_a(i\overline{w}_0)$.

Similarly, if DAC and ADC harmonic coefficient $\Delta w_{s)}$ is set on another value $^{II}\Delta w_s$, the corresponding variables in Equation 13 are replaced with $^{II}\overline{Y}_d(w)$ and $^{II}Y_a(w)$ as a second set.

Finally, a total of six equations from the two sets are simultaneously solved to acquire solutions for a total of six unknown variables of $\zeta_i$ and $\rho_i$ where i=1, 2, 3. To summarize, the number of measurement values, the sets of Equation 13, and DUTs are the same as two. The number of equations in Equation 13 and the highest-order of harmonics are the same as three. Such solutions are identified only once prior to production testing. In the production testing, two loopback measurements are performed using $^I\Delta w_s$ and $^{II}\Delta w_s$ as the first stage. The two sets of harmonics from those measured loopback responses are plugged into $^I|Y_a(i\overline{w}_0)|$ and $^{II}|Y_a(i\overline{w}_0)|$ in the solutions as the second stage. Then, the solutions readily provide $\zeta_i$ and $\rho_i$, that is, accurate harmonic coefficients of individual DUTs, which indicates that a fault-masking problem may be resolved.

Figure 6:
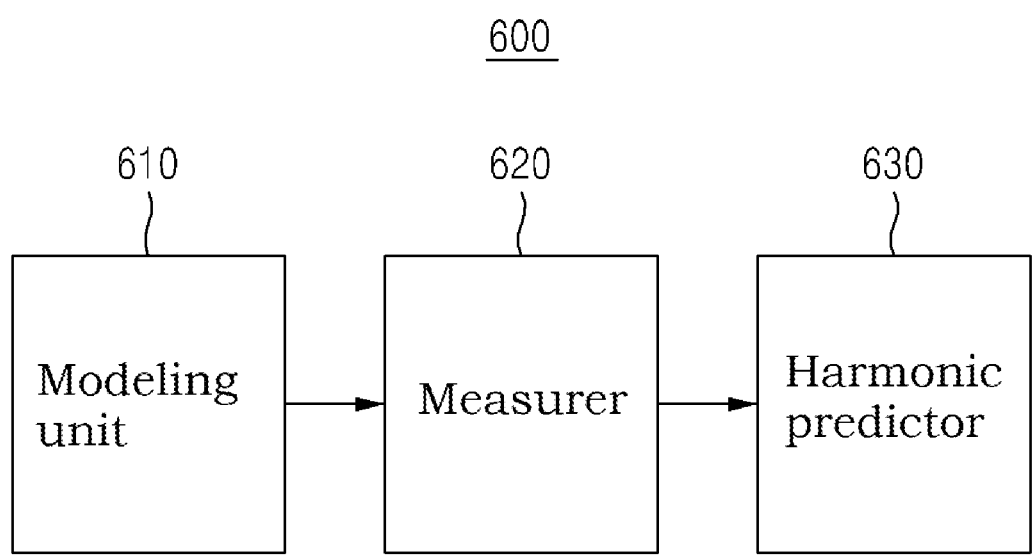
FIG. 6 is a block diagram illustrating a detailed configuration of a loopback system for predicting performance of a mixed-signal circuit according to an example embodiment.

FIG. 6 is a block diagram illustrating a detailed configuration of a loopback system for predicting performance of a mixed-signal circuit according to an example embodiment.

Referring to FIG. 6, a spectral leakage-driven loopback system for predicting performance of a mixed-signal circuit according to an example embodiment precisely predicts nonlinearity of a mixed-signal circuit in a loopback mode.

To this end, a loopback system 600 for predicting performance of a mixed-signal circuit may include a measurer 620 and a harmonic predictor 630, and may further include a modelling unit 610.

The modelling unit 610 may model a correlation by deriving a transfer function of a loopback path prior to executing the measurer 620.

The modelling unit 610 may acquire a specific model by deriving the transfer function of the loopback path that is a path from a DAC channel to an ADC channel through an analog loopback path and thereby modeling the correlation. Here, the specific model represents the aforementioned Equation 13 and may describe loopback responses that are determined by individual DAC and ADC harmonic coefficients and harmonics of DAC and ADC channels.

The measurer 620 generates a digitally-synthesized single-tone sinusoidal stimulus using an on-chip DSP core, samples in a nonlinear DAC channel, supplies a DAC output signal to a nonlinear ADC channel through the analog loopback path, and measures each of the DAC channel and the ADC channel for production testing.

The measurer 620 may generate the digitally-synthesized single-tone sinusoidal stimulus using the on-chip DSP core, and the digitally-synthesized single-tone sinusoidal stimulus may be sampled for test purposes by the nonlinear DAC channel.

Then, the measurer 620 may deliver the spectrally weighted DAC output signal to the nonlinear ADC channel through the analog loopback path. Here, the analog loopback path delivers the spectrally weighted DAC output signal to another DUT (e.g., the nonlinear ADC channel) without any modification of the sampled DAC output signal.

The harmonic predictor 630 performs postprocessing using the on-chip DSP core and predicts harmonics of the two individual DAC channel and ADC channel.

The harmonic predictor 630 may perform postprocessing using the on-chip DSP core and thereby predict the harmonics of the two individual DAC channel and ADC channel to calculate DUT harmonics.

The harmonic predictor 630 may calculate a harmonic coefficient of each of the DAC channel and the ADC channel from the loopback response through the analog loopback path and DAC and ADC harmonic coefficients.

Although the example embodiments are described with a limited example embodiment and drawings, it will be apparent to one of ordinary skill in the art that various modification and alternations may be made from the description.

What is claimed is:

1. A spectral leakage-driven loopback method for predicting performance of a mixed-signal circuit, the method comprising:
generating, by an on-chip Digital Signal Processor (DSP) core, a digitally-synthesized single-tone sinusoidal stimulus, sampling in a nonlinear digital-to-analog-converter (DAC) channel, supplying a DAC output signal to a nonlinear analog-to-digital converter (ADC) channel through an analog loopback path, and measuring each of the DAC channel and the ADC channel for a production testing; and
performing, by the on-chip DSP core, postprocessing and predicting harmonics of the two individual DAC channel and ADC channel.

2. The method of claim 1, wherein the measuring each of the DAC channel and the ADC channel comprises generating, by the on-chip DSP core, the digitally-synthesized single-tone sinusoidal stimulus, and
the digitally-synthesized single-tone sinusoidal stimulus is sampled by the nonlinear DAC channel.

3. The method of claim 2, wherein the DAC output signal represents a correlation between DAC harmonics and spectral leakage introduced by incoherent sampling by a DAC harmonic coefficient.

4. The method of claim 3, wherein the measuring each of the DAC channel and the ADC channel comprises delivering a spectrally weighted DAC output signal to the nonlinear ADC channel through the analog loopback path without modification of the sampled DAC output signal.

5. The method of claim 4, wherein a loopback response through the analog loopback path represents a correlation between ADC harmonics and the DAC output signal according to a spectral leakage by the DAC harmonics and the DAC and ADC harmonic coefficients.

6. The method of claim 1, wherein the predicting the harmonics of the DAC channel and the ADC channel comprises predicting, by the on-chip DSP core, postprocessing and performing harmonics of the two individual DAC channel and ADC channel to calculate device under test (DUT) harmonics.

7. The method of claim 6, wherein the performing the harmonics of the DAC channel and the ADC channel comprises calculating a harmonic coefficient of each of the DAC channel and the ADC channel from a loopback response through the analog loopback path and the DAC and ADC harmonic coefficients.

8. The method of claim 1, further comprising:
modeling a correlation by deriving a transfer function of a loopback path prior to measuring each of the DAC channel and the ADC channel.

9. The method of claim 8, wherein the modeling the correlation comprises acquiring a specific model by deriving the transfer function that is a path from the DAC channel to the ADC channel through the analog loopback path and thereby modeling the correlation.

10. The method of claim 9, wherein the specific model represents loopback responses that are determined by DAC and ADC harmonic coefficients and harmonics of the DAC channel and the ADC channel.

11. A spectral leakage-driven loopback system for predicting performance of a mixed-signal circuit, the system comprising:
a measurer configured to generate, using an on-chip Digital Signal Processor (DSP) core, a digitally-synthesized single-tone sinusoidal stimulus, to sample in a nonlinear digital-to-analog converter (DAC) channel, to supply a DAC output signal to a nonlinear analog-to-digital converter (ADC) channel through an analog loopback path, and to measure each of the DAC channel and the ADC channel for a production testing; and
a harmonic predictor configured to perform, using the on-chip DSP core, postprocessing and to predict harmonics of the two individual DAC channel and ADC channel.

12. The system of claim 11, wherein the measurer is configured to generate, using the on-chip DSP core, the digitally-synthesized single-tone sinusoidal stimulus, and the digitally-synthesized single-tone sinusoidal stimulus is sampled by the nonlinear DAC channel.

13. The system of claim 12, wherein the measurer is configured to deliver a spectrally weighted DAC output signal to the nonlinear ADC channel through the analog loopback path without modification of the sampled DAC output signal.

14. The system of claim 11, wherein the harmonic predictor is configured to predict, using the on-chip DSP core, postprocessing and to perform harmonics of the two individual DAC channel and ADC channel to calculate device under test (DUT) harmonics.

15. The system of claim 14, wherein the harmonic predictor is configured to calculate a harmonic coefficient of each of the DAC channel and the ADC channel from a loopback response through the analog loopback path and the DAC and ADC harmonic coefficients.

16. The system of claim 11, further comprising:
a modeling unit configured to model a correlation by deriving a transfer function of a loopback path prior to executing the measurer.

17. The system of claim 16, wherein the modeling unit is configured to acquire a specific model by deriving a transfer function of the loopback path that is a path from the DAC channel to the ADC channel through the analog loopback path and thereby modeling the correlation.

\* \* \* \* \*